US 7,406,645 B2

(12) United States Patent
Nozuyama

(10) Patent No.: US 7,406,645 B2
(45) Date of Patent: Jul. 29, 2008

(54) TEST PATTERN GENERATING APPARATUS, METHOD FOR AUTOMATICALLY GENERATING TEST PATTERNS AND COMPUTER PROGRAM PRODUCT FOR EXECUTING AN APPLICATION FOR A TEST PATTERN GENERATING APPARATUS

(75) Inventor: Yasuyuki Nozuyama, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 543 days.

(21) Appl. No.: 11/158,261

(22) Filed: Jun. 20, 2005

(65) Prior Publication Data

US 2006/0005094 A1   Jan. 5, 2006

(30) Foreign Application Priority Data

Jun. 22, 2004   (JP) .......................... P2004-184177

(51) Int. Cl.
*G01R 31/28* (2006.01)
(52) U.S. Cl. ..................................... 714/738
(58) Field of Classification Search ................. 714/738
See application file for complete search history.

(56) References Cited

U.S. PATENT DOCUMENTS

| 5,257,268 | A | * | 10/1993 | Agrawal et al. ............. 714/738 |
| 5,414,716 | A | * | 5/1995 | Bershteyn .................... 714/738 |
| 5,485,471 | A | * | 1/1996 | Bershteyn .................... 714/739 |
| 6,567,946 | B1 | | 5/2003 | Nozuyama |
| 6,766,473 | B2 | | 7/2004 | Nozuyama |
| 7,065,690 | B1 | * | 6/2006 | Yoshida et al. .............. 714/724 |

FOREIGN PATENT DOCUMENTS

| JP | 11-025147 | 1/1999 |
| JP | 11-052030 | 2/1999 |
| JP | 2001-127163 | 5/2001 |
| JP | 2003-107138 | 4/2003 |

OTHER PUBLICATIONS

U.S. Appl. No. 10/758,446, filed Jan. 2004, Nozuyama.
U.S. Appl. No. 10/678,975, filed Oct. 2003, Nozuyama.
Nozuyama, et al., "A Method for Estimating and Enhancing Test Quality Using Layout Information," Technical Report of IEICE (Japan), vol. CPM2002-152, pp. 1-6, (2003).
Sengupta, et al., "Defect-Based Test: A Key Enabler For Successful Migration to Structural Test," Intel Technology Journal, pp. 1-14, (1999).
Stroud, et al., "Bridging Fault Extraction from Physical Design Data for Manufacturing Test Development," Proc. IEEE International Test Conference, pp. 760-769, (2000).

* cited by examiner

*Primary Examiner*—James C Kerveros
(74) *Attorney, Agent, or Firm*—DLA Piper US LLP

(57) ABSTRACT

A test pattern generating apparatus includes an extractor configured to extract a plurality of layout parameters (elements) of a circuit under test based on gate net information and layout information of the circuit, and to link the layout parameters (elements) with corresponding fault models respectively. A weight calculator is configured to calculate a weight for each fault model linked with the layout parameters (elements) for both a plurality of undetected faults of the fault model and a plurality of faults detected by a plurality of test patterns, based on process failure (defect) information and layout parameter (element) information. An automatic test pattern generator is configured to generate the test patterns in accordance with the weight of each fault model linked with the layout parameters (elements).

20 Claims, 11 Drawing Sheets

TEST PATTERN GENERATING APPARATUS, METHOD FOR AUTOMATICALLY GENERATING TEST PATTERNS AND COMPUTER PROGRAM PRODUCT FOR EXECUTING AN APPLICATION FOR A TEST PATTERN GENERATING APPARATUS

CROSS REFERENCE TO RELATED APPLICATION AND INCORPORATION BY REFERENCE

This application is based upon and claims the benefit of priority from the prior Japanese Patent Applications No. P2004-184177, filed on Jun. 22, 2004; the entire contents of which are incorporated herein by reference.

BACKGROUND OF THE INVENTION

1. Field of the Invention

The present invention relates to a test technology of semiconductor integrated circuits, and more particularly, relates to a test pattern generating apparatus, a method for automatically generating test patterns, and a computer program product for executing an application for a test pattern generating apparatus capable of automatically generating the test patterns.

2. Description of the Related Art

Recently, a large-scale integrated circuit (LSI) called a system on chip (SOC) has been widely developed. The LSI is frequently manufactured by use of a deep sub-micrometer (DSM) process using metal wires having a width less than or equal to 0.2 μm to 0.1 μm. With respect to the LSIs manufactured by the DSM process, it frequently occurs that elements and processes that have been not problems become serious problems at the sub-micrometer level. Similar problems occur to random logic circuits (logic circuit blocks arranged by connections of combinational logic gates and memories such as flip-flops and latch circuits), which are the subject of the present invention. In the past, a methodology in which test patterns are manually generated (performed as a function test), an automatic test pattern generation (ATPG) methodology in which test patterns are automatically generated by utilizing a scan test technique, and a built-in self test (BIST) methodology in which a test circuit for performing a test is embedded in a LSI have been known for generating test patterns for device under test (DUT). The quality of the test patterns is evaluated by a fault coverage that is a proportion of the number of single stuck-at faults detected by the test patterns to single stuck-at faults (having a number of 2N when there are N nodes or input/output terminals of primitive cells), each one of which is assumed at a node (wire) between basic cells or an input/output terminal of a primitive cell inside the DUT, being fixed to either power supply potential (VDD) or ground potential (GND) of the DUT. The necessary test quality is regarded as being achieved by improving the fault coverage to a required level (95% for instance). In order to cope with the DSM process, it is necessary to increase the required fault coverage closer to 100% (98% for instance). However, with respect to LSIs manufactured by the DSM process, achieving sufficient test quality by only utilizing the stuck-at fault model is difficult.

An essential problem of the concept of the fault coverage of the stuck-at fault model is that the fault coverage only considers the rate of a number of detected faults to the number of supposed faults for the gate net of LSI not having the layout information. Accordingly, it is impossible to obtain correlation of the calculated fault coverage with high precision though it is possible to expect a correlation of the calculated fault coverage (test quality) with fault occurrence of an actual LSI to a certain extent. Furthermore, it is impossible to set appropriate criteria of test quality, so that test patterns tend to be more than necessary. Since it is impossible to add test patterns to highly possible faults based on layout information, sometimes the expected test quality cannot be obtained regardless of the resources for generating and adding test patterns.

Regarding the problem mentioned above, a weighting technique of associating appropriate layout information (layout parameters) with faults, and of estimating the result of a fault simulation as weighted fault coverage has been proposed. As a result, it is possible to improve the precision of correlating process failure rate by adding an appropriate layout weight to a fault following the stuck-at fault model, by executing a fault simulation, and obtaining weighted fault coverage. Moreover, it is possible to effectively reduce resources of adding test patterns by giving clear priority so as to detect undetected faults.

Another essential problem associated with a test utilizing the stuck-at fault model is that the coverage of detected basic faults, such as wire shorts (bridge faults) is unclear though it is possible to check detection of faults of connection nodes or input/output terminals of primitive cells in DUT. Some experimental results in which these basic faults are secondarily detected by improving coverage of stuck-at faults has been reported. However, since improvement of test quality is very difficult in a DSM process, it is difficult to obtain predetermined test quality. With respect to the problem mentioned above, a tool for extracting bridge faults from layout information, and for executing a fault simulation and the ATPG has been recently marketed. Furthermore, in the DSM process, it is necessary to consider an open fault model and a delay fault model.

The test patterns are individually generated in essence only by accumulating a combination of fault models and layout parameters required for maintaining quality of LSIs manufactured by the DSM process. Accordingly, the test pattern size (test pattern length), and the test period (test cost) in a shipping test, greatly increases. However, a technique of effectively reducing test pattern size for the combination of the fault models and the layout parameters has not been proposed.

SUMMARY OF THE INVENTION

An aspect of the present invention inheres in a test pattern generating apparatus encompassing, an extractor configured to extract a plurality of layout parameters (elements) of a circuit under test based on gate net information and layout information of the circuit, and to link the layout parameters (elements) with corresponding fault models respectively, a weight calculator configured to calculate a weight for each fault model linked with the layout parameters (elements) for both a plurality of undetected faults of the fault model and a plurality of faults detected by a plurality of test patterns, based on process failure (defect) information and layout parameter (element) information, an automatic test pattern generator configured to generate the test patterns in accordance with the weight of each fault model linked with the layout parameters (elements), a test pattern selector configured to select a plurality of effective test patterns from the generated test patterns, based on the weight calculated by the weight calculator, and a judgment unit configured to judge whether a fault coverage of the selected test patterns satisfies a required fault coverage set to the layout parameter (element) information.

Another aspect of the present invention inheres in a method for automatically generating test patterns encompassing, extracting a plurality of layout parameters (elements) of a circuit under test based on gate net information and layout information of the circuit, and linking the layout parameters (elements) with corresponding fault models respectively, calculating a weight for each fault model linked with the layout parameters (elements) for both a plurality of undetected faults of the fault model and a plurality of faults detected by a plurality of test patterns, based on process failure (defect) information and layout parameter (element) information, generating the test patterns in accordance with the weight of each fault model linked with the layout parameters (elements), selecting a plurality of effective test patterns from the generated test patterns, based on the calculated weight, and determining whether a fault coverage of the selected test patterns satisfies a required fault coverage set to the layout parameter (element) information.

Still another aspect of the present invention inheres in a computer program product for executing an application for a test pattern generating apparatus encompassing, instructions configured to extract a plurality of layout parameters (elements) of a circuit under test based on gate net information and layout information of the circuit, and to link the layout parameters (elements) with corresponding fault models respectively, instructions configured to calculate a weight for each fault model linked with the layout parameters (elements) for both a plurality of undetected faults of the fault model and a plurality of faults detected by a plurality of test patterns, based on process failure (defect) information and layout parameter (element) information, instructions configured to generate the test patterns in accordance with the weight of each fault model linked with the layout parameters (elements), instructions configured to select a plurality of effective test patterns from the generated test patterns, based on the calculated weight, and instructions configured to judge whether a fault coverage of the selected test patterns satisfies a required fault coverage set to the layout parameter (element) information.

DETAILED DESCRIPTION OF THE INVENTION

Figure 1:
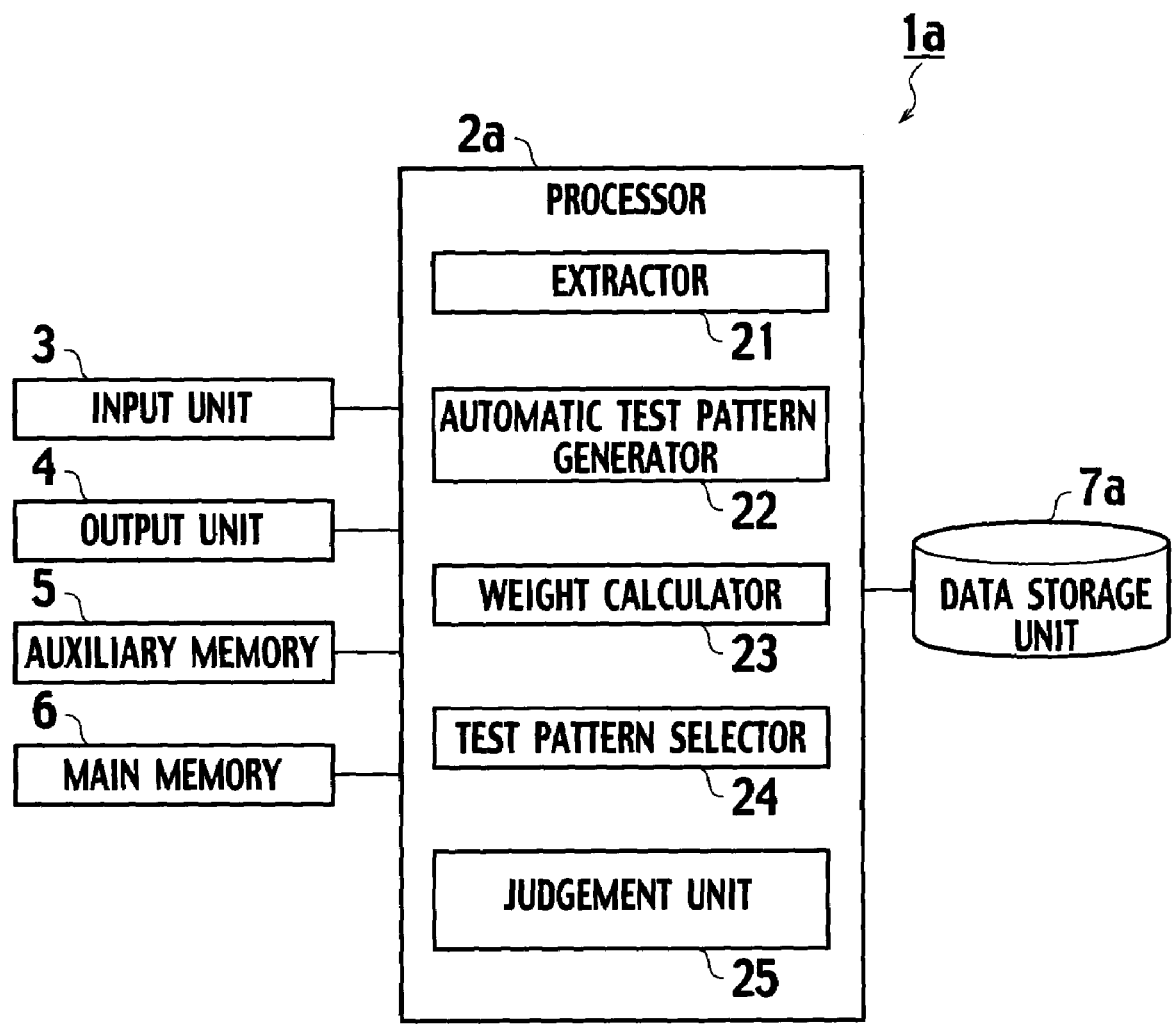
FIG. 1 is a block diagram showing a test pattern generating apparatus according to a first embodiment of the present invention.

Various embodiments of the present invention will be described with reference to the accompanying drawings. It is to be noted that the same or similar reference numerals are applied to the same or similar parts and elements throughout the drawings, and description of the same or similar parts and elements will be omitted or simplified. In the following descriptions, numerous specific details are set forth, such as specific signal values, etc., to provide a thorough understanding of the present invention. However, it will be obvious to those skilled in the art that the present invention may be practiced without such specific details. In other instances, well-known circuits have been shown in block diagram form in order not to obscure the present invention with unnecessary detail.

First Embodiment

As shown in FIG. 1, a test pattern generating apparatus 1*a*, according to a first embodiment of the present invention, includes a processor 2*a*, an input unit 3 connected to the processor 2*a*, an output unit 4 connected to the processor 2*a*, an auxiliary memory 5 connected to the processor 2*a*, a main memory 6 connected to the processor 2*a*, and a data storage unit 7*a* connected to the processor 2*a*. The processor 2*a* includes an extractor 21, a test pattern generator 22, a weight calculator 23, a test pattern selector 24, and a judgment unit 25. The extractor 21 extracts a plurality of layout parameters (elements) of a circuit under test based on gate net information and layout information of the circuit, and links the layout parameters (elements) with corresponding fault models respectively. The weight calculator 23 calculates a weight for each fault model linked with the layout parameters (elements) for both a plurality of undetected faults of the fault model and a plurality of faults detected by a plurality of test patterns, based on process failure (defect) information and layout parameter (element) information. The automatic test pattern generator 22 generates the test patterns in accordance with the weight of each fault model linked with the layout parameters (elements). The test pattern selector 24 selects a plurality of effective test patterns from the generated test patterns, based on the weight calculated by the weight calculator. The judgment unit 25 judges whether a fault coverage of the selected test patterns satisfies a required fault coverage set to the layout parameter (element) information.

Moreover, the weight calculator 23 calculates a weighted fault coverage of each fault model and an overall (total) weighted fault coverage of all fault models. With respect to the undetected faults, the weight calculator 23 calculates a weight by considering the contribution of the detection-expected faults and the difference from the required fault coverage, and gives priority (precedence) to fault model for generating test patterns. The judgment unit 25 judges whether the fault coverage of the all selected test patterns satisfies the required fault coverage set to the layout parameter (element)

information. Here, the "required fault coverage" refers to a fault coverage target of each fault model to the test patterns.

Figure 2:
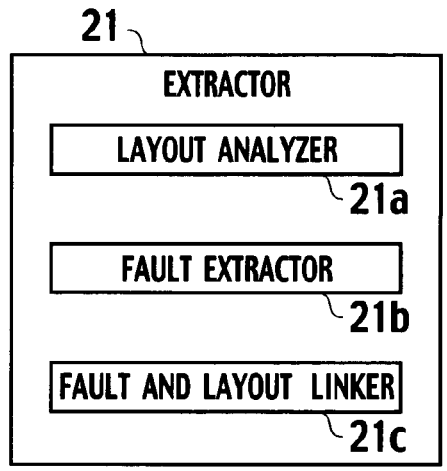
FIG. 2 is a block diagram showing an extractor according to the first embodiment.

As shown in FIG. 2, the extractor 21 includes a layout analyzer 21a, fault extractor 21b, and fault and layout linker 21c. The layout analyzer 21a analyzes the entire layout of the circuit under test based on the layout information, and extracts layout parameter (element) information. The fault extractor 21b extracts faults from the gate net information and the layout information, and compiles an undetected fault list. The fault and layout linker 21c links (associates) the detected and undetected fault list with the layout parameter (element) information.

Figure 3:
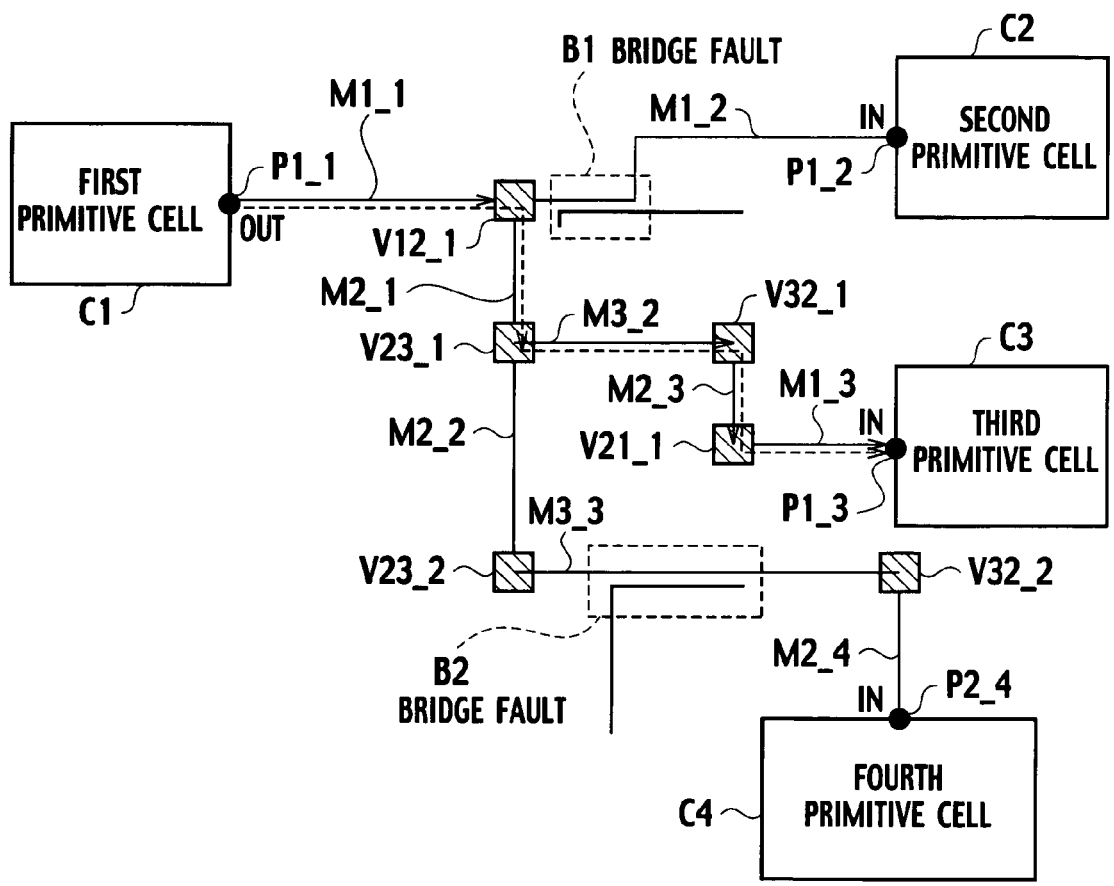
FIG. 3 is a schematic diagram showing an example of layout parameters according to the first embodiment.

In order to explain a relationship between the fault and the layout parameters (elements), a layout example connecting first to fourth basic cells C1 to C4 is shown in FIG. 3. In the layout example shown in FIG. 3, the layout parameters (elements) are expressed in accordance with the notation "C|P|M|V Layer (Layer)_a serial number". Here, "C" denotes a primitive cell, "P" denotes a terminal (pin), "M" denotes a metal wire portion, and "V" denotes a via (of a minimum size, written as only 'via' hereafter), respectively. "Layer" denotes a layer of the metal wire (layers 1, 2, 3, ... from the bottom). An input terminal P1_2 of the second primitive cell C2 is connected to an output terminal P1_1 of a first primitive cell C1 by wire elements M1_1 and M1_2. Although a via V12_1 is located at a connection point of the wires M1_1 and M1_2, the via V12_1 is not included since the via V12_1 is unrelated to a connection between the terminals P1_1 and P1_2.

An input terminal P1_3 of the third primitive cell C3 is connected to an output terminal P1_1 of the first primitive cell C1 by wire elements M1_1, M2_1, M3_2, M2_3, and M1_3, and vias V12_1, V23_1, V32_1, and V21_1. An input terminal P2_4 of the fourth primitive cell C4 is connected to an output terminal P1_1 of the first primitive cell C1 by wire elements M1_1, M2_1, M2_2, M3_3, and M2_4, and vias V12_1, V23_2, and V32_2. The vias V12_1, V23_2, V32_1, V21_1, and V32_2 are formed so as to connect the wire of two vertically separated layers.

The layout analyzer 21a shown in FIG. 2 calculates the length of the wire elements, the number of vias, and the area of primitive cells having output terminal connected to the path, for each path between the basic cells as the layout parameter (element) information by utilizing the aforementioned path notation. The fault extractor 21b extracts stuck-at faults of the output terminal P1_1 and the input terminals P1_2, P1_3, and P2_4 as a fault model, and detects bridge faults B1 and B2 of the wire elements M1_2 and M3_3 as a fault model, for instance. Here, the term "(pin) stuck-at fault" refers to a fault where one of the output terminal (pin) P1_1 and the input terminals (pins) P1_2, P1_3, and P2_4 is fixed to either power supply potential (VDD) or ground potential (GND). A stuck-at fault fixed to the ground electric potential having a logic value "0" is referred to as "stuck-at zero fault". A stuck-at fault fixed to the power supply potential having a logic value "1" is referred to as "stuck-at one fault".

The term "bridge fault" refers to a fault caused by a short between adjacent wire patterns. The total sum of the length of wire portions in neighborhood of targeted wire may be utilized as a wire length for weighting the stuck-at fault. The weight calculator may individually weight wire portions adjacent to power supply wire having an electric potential of a supposedly stuck-at fault and another wire portion.

Figure 4:
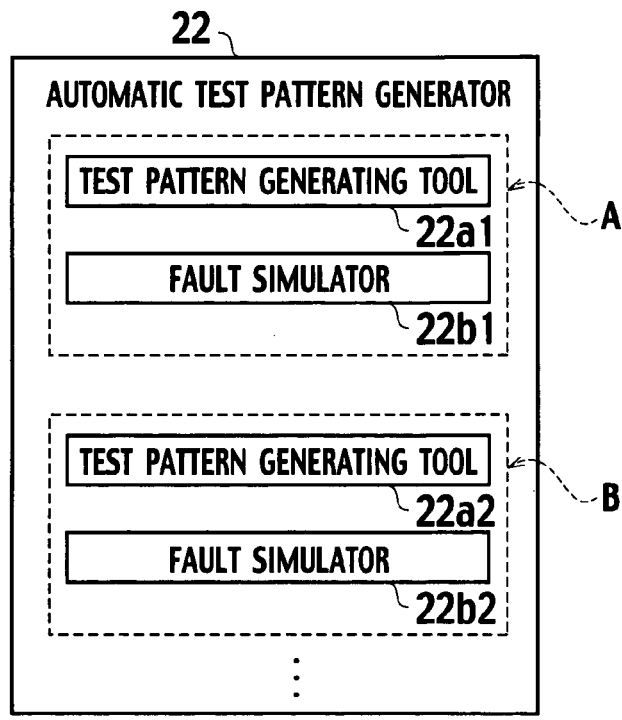
FIG. 4 is a block diagram showing an automatic test pattern generator according to the first embodiment.

As shown in FIG. 4, the test pattern generator 22 shown in FIG. 1 includes test pattern generating tools 22a1, 22a2, ... and fault simulators 22b1, 22b2, ..., corresponding to each of the fault models. In FIG. 4, the test pattern generating tool 22a1 and the fault simulator 22b1 correspond to the fault model A, the test pattern generating tool 22a2 and the fault simulator 22b2 correspond to the fault model B, and so on. The test pattern generating tool automatically generates test patterns to predetermined faults, as those to be detected, in accordance with the weight of the undetected faults of a corresponding fault model. By test patterns generated for each fault model, the fault simulation estimates how many faults of the same model and the other fault models are detected. As a result, by considering the other fault models, it is possible to estimate a total weight of the test patterns generated by each of test pattern generating tools.

Figure 5:
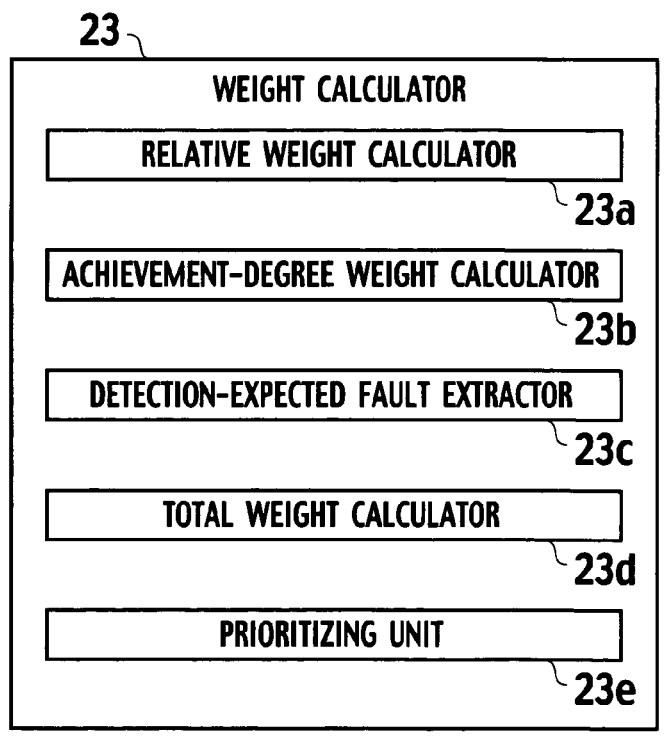
FIG. 5 is a block diagram showing a weight calculator according to the first embodiment.

As shown in FIG. 5, the weight calculator 22 shown in FIG. 1 includes a relative weight calculator 23a, an achievement-degree weight calculator 23b, a detection-expected fault extractor 23c, a total weight calculator 23d, and a prioritizing unit 23e. The relative weight calculator 23a decides or selects a fault model linked with the layout parameter (element) information based on process failure (defect) information including a failure (defect) occurrence frequency. The relative weight calculator 23a calculates a relative weight among the fault models linked with the layout parameter (element) information, and calculates required weighted fault coverage.

With respect to the calculation of the relative weight and the required weighted fault coverage, a system can be used by providing a weighted test pattern generator corresponding to the fault models linked with the layout parameter (element) information to be used in the processor 2a, selecting the fault models in accordance with an object LSI, and directly supplying the relative weights and the required weighted fault coverages via the input unit 3. This system can be used because it is difficult to execute the calculation by automatically selecting the fault models. The achievement-degree weight calculator 23b calculates an achievement-degree for each fault model linked with the layout parameter (element) information. The "achievement-degree" is a weight corresponding to undetected faults. The detection-expected fault extractor 23c extracts a fault (an undetected fault) and other faults detected or expected to be detected with it at the same time and merges the object fault and the other faults as "detection-expected faults". The total weight calculator 23d calculates the weight corresponding to layout parameters (elements) of each undetected fault, including its detection-expected faults. The prioritizing unit 23e calculates weights considering the relative weight and the achievement-degree weights based on weights corresponding to layout elements of individual undetected faults including detection-expected faults, and according to the weights, decides the priority of generation of test patterns. The prioritizing unit 23e may calculate weight by adding the cost of test patterns as a weight to the relative weight and the achievement-degree weight, and decide a priority for generation of test patterns. The "test pattern cost" refers to the cost of a test required for supplying a test pattern of a specific test for an objective fault to a LSI.

An example of layout parameters (elements), actual faults, relative weight, and required weighted fault coverage capable of cooperating with fault models is shown in table 1.

TABLE 1

| Fault model | Corresponding layout parameter (element) | Corresponding fault (defect) | Relative weight | Required weighted fault coverage |
| --- | --- | --- | --- | --- |
| Pin stuck-at | Number of via | Via open | W1 | 99% |

TABLE 1-continued

| Fault model | Corresponding layout parameter (element) | Corresponding fault (defect) | Relative weight | Required weighted fault coverage |
|---|---|---|---|---|
| Pin stuck-at | Wire length | Disconnection of wire | W2 | 95% |
| Pin stuck-at | Cell area Wire length | Defect of layout elements in cell Short between wire and other layout elements | W3 | 99% |
| Bridge | Adjacent wire length | Short between neighboring wires | W4 | 98% |
| Transition delay | Wire length Number of via Cell area | Resistive wire Resistive via Resistive defect of layout elements in cell | W5 | 95% |
| Path delay | Number of via on critical logic path Wire length Cell area | Wire resistance Via resistance Resistive defect of layout elements in cell | W6 | 95% |

The relative weight is set to a high value when a frequency of fault occurrence is high. The relative weight is set to a low value when a frequency of fault occurrence is low. The required weighted fault coverage may be a low value when the frequency of occurrence and the relative weight of the corresponding faults are low. When there is a plurality of corresponding process defects, the relative weights may be hierarchically defined. For example, as shown in the transition fault in Table 1, the relative weights are set to layout elements related to the transition fault (w1 and w2, where w1+w2=1 for instance), the overall relative weight of the transition fault may be arranged so as to have an relative weight W5.

It is appropriate that layout parameter (element) weight of the pin stuck-at fault of input terminals P1_2, P1_3, and P2_4 is associated with the wire length and the number of vias on the path from output terminal P1_1 shown in FIG. 3 to input terminals P1_2, P1_3, and P2_4 (with respect to the wire length, there are some choices). The pin stuck-at faults of the input terminals P1_2, P1_3, and P2_4 are associated with open vias and a disconnection of wire as process defects.

It is appropriate that layout parameter (element) weight of the pin stuck-at fault of output terminal P1_1 shown in FIG. 3 is associated with an area of the first primitive cell C1 and a total wire length of the wire connected to the terminal P1_1. The pin stuck-at fault of the output terminal P1_1 is associated with faults of various layout elements in the primitive cells and short faults between the wire and layout elements formed on the wire. Further detail layout parameters (elements) in the primitive cells may be associated, to obtain more exact correlation with process defects.

It is appropriate that layout parameter (element) weight of the bridge fault B1 shown in FIG. 3 is associated with wire length (adjacent wire length) of an adjacent portion of wire elements M1_2 and an adjacent wire. The bridge fault B1 is associated with a short of neighboring wire elements as a process defect.

For an example, the detection-expected fault extractor 23c extracts the bridge fault B1 as a detection-expected fault when a stuck-at zero fault of the input terminal P1_2, shown in FIG. 3, is undetected. In this case, it is appropriate to calculate a value of the weight of layout elements multiplied by "½" as a weight of a bridge fault, since a value of another wire should be "1", so as to detect the bridge fault.

Equivalent faults and representative faults can be cited as a simple example. The equivalent faults are faults outputting identical value against all test patterns. The representative faults are faults selected for representing the set of equivalent faults. When a representative fault is detected, the corresponding equivalent faults are also detected.

The prioritizing unit 23e especially considers that a fault at an (only-one) input end of a signal wire (connected to an output terminal of a primitive cell) is automatically detected when a fault at each output end of the wire (connected to an input terminal of a primitive cell) is detected. The layout element weight (area of primitive cell) added to undetected faults supposed to the output terminal (input end of signal wires) is fundamentally transferred and added to the undetected fault weight supposed to each input terminal. For example, when the pin stuck-at fault of the output terminal P1_1 of FIG. 3 is undetect, the area of the first primitive cell C1 is added to the undetect pin stuck-at faults of the input terminals P1_2, P1_3, P2_4 as the weight.

The term "delay fault" refers to a fault which malfunction in actual operational speed of a high clock frequency of a LSI though it is possible to normally operate in a test of a low clock frequency. The term "transition delay fault" refers to a delay fault supposing a large delay to input/output of a primitive cell or a primitive cell. The layout parameters (elements) supposed to the input terminal is similar to pin stuck-at faults. The transition delay fault is corresponded to a high resistive fault of vias and that caused by a strong decrease of wire width. As for the transition fault supposed to an output terminal of a primitive cell, it is appropriate that the layout parameters (elements) weighted to the fault is an area of the primitive cell. The area of a primitive cell is corresponded to a high resistive fault of various layout parameters (elements) in a primitive cell.

The term "path delay fault" refers to a delay fault supposed to a logical path through a plurality of primitive cell. The layout parameters (elements) of the path delay fault are the wire length corresponding to the logical path, the number of vias on the logical path, and the area of a basic cell. The layout parameters are associated with high resistance caused by a strong decrease of wires, a high resistive fault of vias, and a resistive fault of various layout parameters (elements) in a basic cell. The difference of the transition delay fault and the path delay fault is a difference of a fault model. Either one of the transition delay fault and the path delay fault or both the transition delay fault and the path delay fault may be utilized.

Figure 6:
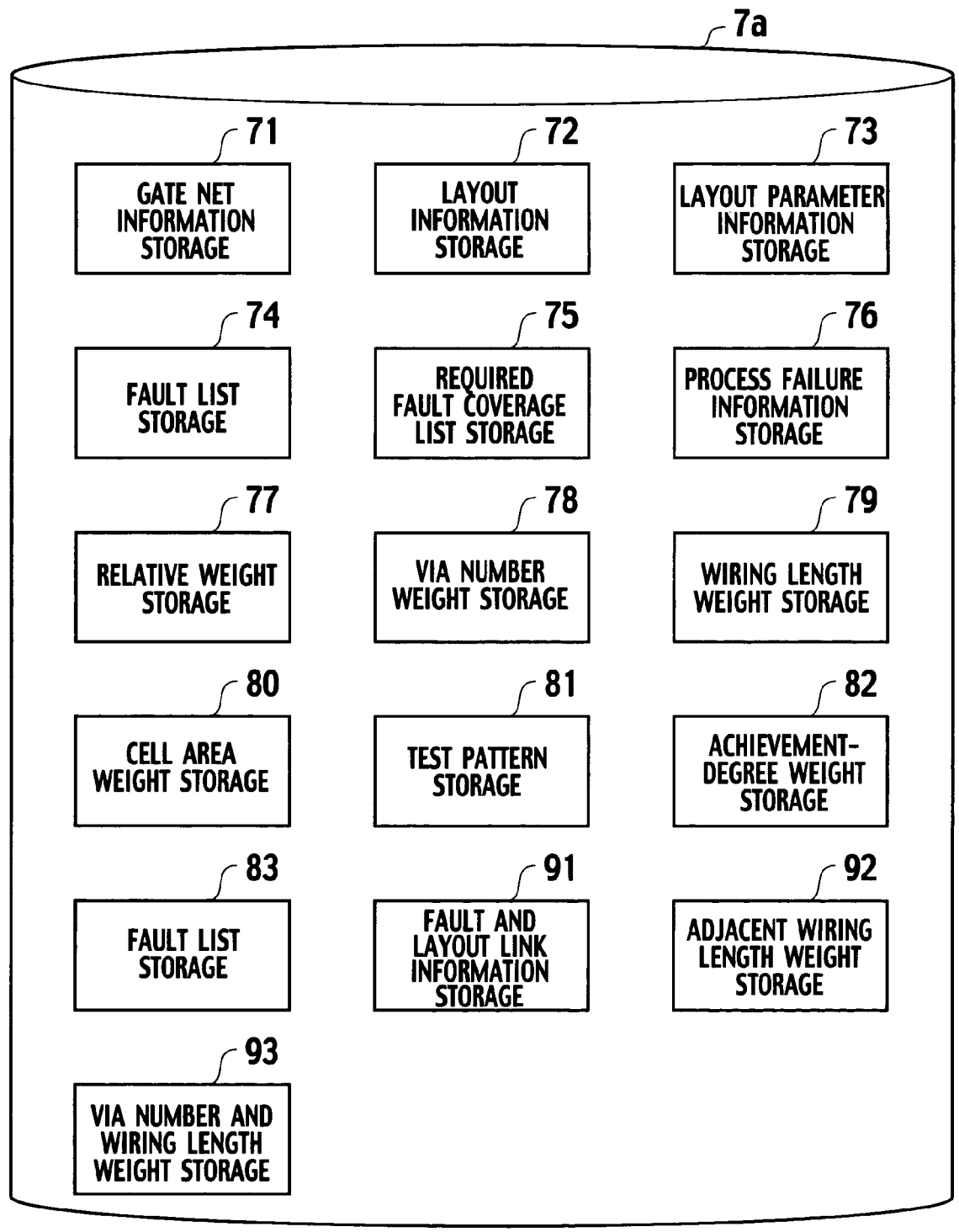
FIG. 6 is a block diagram showing a data storage according to the first embodiment.

As shown in FIG. 6, the data storage unit 7a shown in FIG. 1 includes a gate net information storage 71, a layout information storage 72, a layout parameter (element) information storage 73, a fault list storage 74, a required fault coverage list storage 75, a process failure (defect) information storage 76, a relative weight storage 77, a via number weight storage 78, a wire length weight storage 79, a cell area weight storage 80, a test pattern storage 81, an achievement-degree weight storage 82, a fault and layout link information storage 91, an adjacent wire length weight storage 92, via number and wire length weight storage 93, and fault list storage 83.

The layout parameter (element) information storage 73 stores information such as layout pattern information, wire connection information, information of a position of each end of wire elements, information of a position of vias, the number of wires, and the number of vias. The process failure (defect) information storage 76 stores an occurrence frequency information of a via open, a disconnection of a wire, including resistive open and disconnection, a transistor fault in a basic cell, a short of wires, and a delay fault of the circuit under test. The relative weight storage 77 stores relative weight information of each fault model linked with the layout parameters (elements). The via number weight storage 78 stores a weight of a number of vias as the layout parameter (element) information, a weight of detection-expected faults, and an achievement-degree weight. The wire length weight storage 79 stores a weight of a wire length against each fault, a weight of the wire length against detection-expected faults, and an achievement-degree weight of wire length. The cell area weight storage 80 stores a weight of an area of a cell against each fault, a weight of the area of a cell against detection-expected faults, and an achievement-degree weight of the area of a cell. The adjacent wire length weight storage 92 stores a weight of an adjacent wire length against each fault, a weight of the adjacent wire length against a detection-expected fault, a and achievement-degree weight of the adjacent wire length. The via number and wire length weight storage 93 stores a weight of a number of vias and a wire length on a critical path against each fault, a weight of a number of vias and a wire length on a critical path against a detection-expected fault, a and achievement-degree weight of the number of vias and the wire length on a critical path. The test pattern storage 81 stores test patterns generated by the each test pattern generating tool of the test pattern generator 22, and selected by test pattern selector 24 based on the result of the weight calculator 23. The test pattern storage 81 further stores test patterns generated in steps of adding the test patterns.

It should be noted that the processor 2a includes a database manager and an input/output manager which are not shown in the drawing. Moreover, when an input to or an output from the data memory unit 3 is required, a search for the storage location of a necessary file is conducted by use of the database manager and reading and writing of the file is thereby performed. On the other hand, when an input to or an output from the processor 2a is required, a file is inputted from the input unit 3 or a file is outputted to the output unit 4, the auxiliary memory unit 5 or the like by use of the input/output manager. Here, the data storage unit 7a may be included with the auxiliary memory unit 5 when appropriate.

The input unit 3 may be a keyboard, a mouse or an authentication unit, such as an OCR, a graphic input unit such as an image scanner, a special input unit such as a voice recognition device. The output unit 4 may be a display unit such as a liquid crystal display or a CRT display, a printer such as an ink-jet printer or a laser printer, and the like. The unillustrated input/output manager (an input/output interface) is provided as an interface for connecting the input unit 3, the output unit 4, the auxiliary memory unit 5, a reader for a memory unit such as a CD-ROM, an MO or a flexible disk, or the like to processor 2a. From a data flow viewpoint, the input/output controller is the interface for the input unit 3, the output unit 4, the auxiliary memory unit 5 or the reader for the external memory unit with the main memory 6. The main memory 6 includes a ROM and a RAM. The ROM works as a program memory unit or the like which stores a program to be executed by the processor 2a. The RAM temporarily stores the program for the processor 2a and data which are used during execution of the program, and also works as a temporary data memory used as a work area.

Next, a method for automatically generating test patterns according to the first embodiment of the present invention will be described referring to FIG. 1 to FIG. 7.

Figure 7:
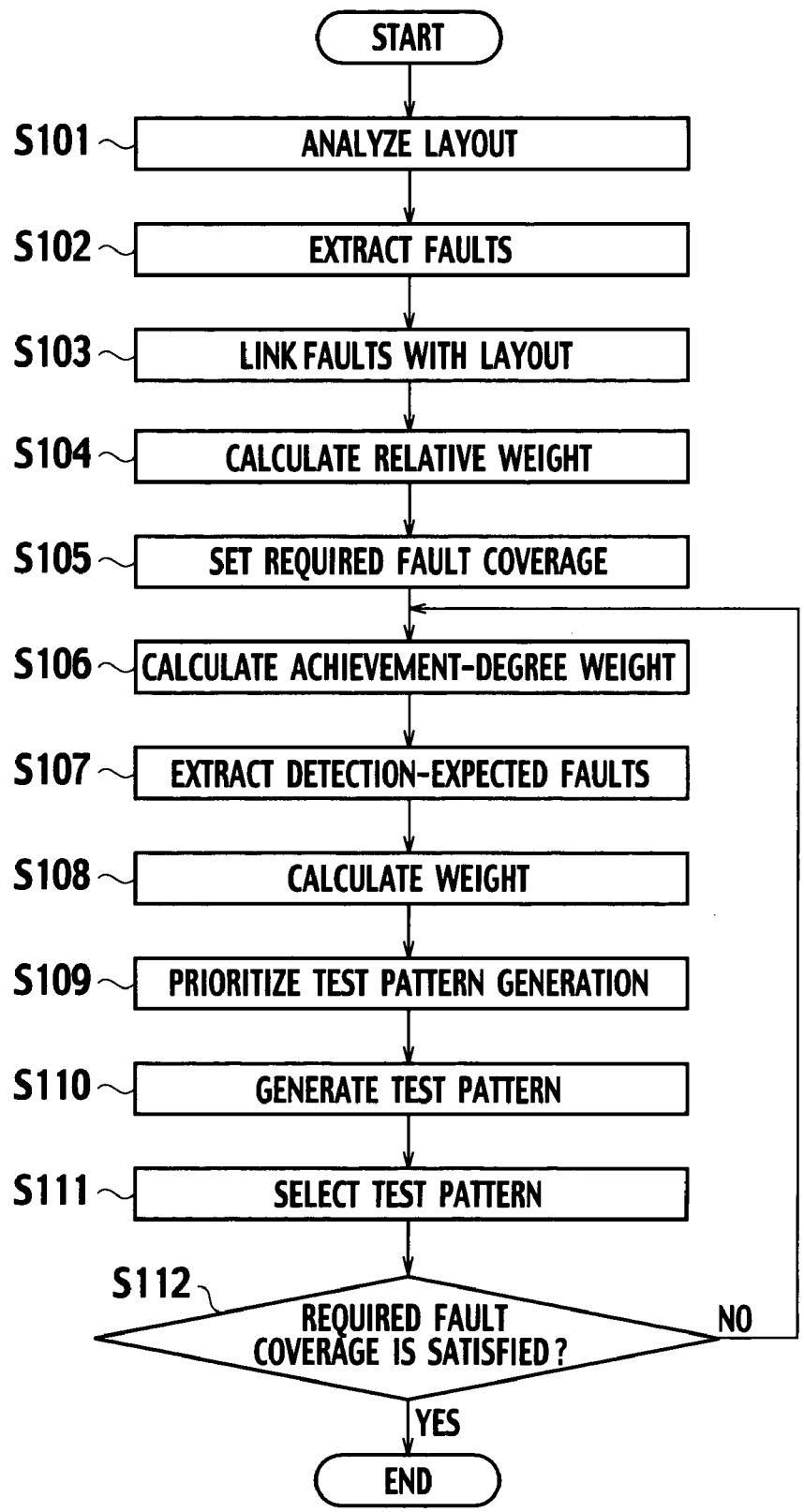
FIG. 7 is a flowchart showing a method for automatically generating test patterns according to the first embodiment.

In step S101 shown in FIG. 7, the layout analyzer 21a, shown in FIG. 2, analyzes an entire layout of a circuit under test, based on layout information stored in a layout information storage 72 shown in FIG. 6, and extracts the layout parameter (element) information. The layout parameter (element) information is stored in a layout parameter (element) information storage 73. The layout analyzer 21a executes a timing analysis of the circuit under test, and further extracts critical path information as the layout parameter (element) information.

In step S102, the fault extractor 21b shown in FIG. 2 detects stuck-at faults or transition delay faults of the circuit under test, from gate net information stored in gate net information storage 71. The fault extractor 21b extracts bridge faults from the layout information and the layout parameter (element) information. Furthermore, the fault extractor 21b extracts path delay faults based on the critical path information. The faults, such as the stuck-at faults, the bridge faults, and delay faults, extracted by the fault extractor 21b are stored in fault list storage 83 shown in FIG. 6. The faults stored in the fault list storage 83 are faults prior to generating test patterns. The test pattern generating tools of the test pattern generator 22 generate test patterns for the faults in the fault list storage 83. A detected and undetected fault list including results of fault detection are stored in the fault list storage 74 shown in FIG. 6, and the detected and undetected fault list is updated.

In step S103, the fault and layout linker 21c shown in FIG. 2 links (associates) the layout parameter (element) information stored in the layout parameter (element) information storage 73 with the detected and undetected fault list stored in the fault list storage 74, and generates fault and layout link information. The fault and layout link information is stored in the fault and layout link information storage 91 shown in FIG. 6. From step S101 to step S103, it is possible to use an identical program since each extraction of the faults and the layout parameters (elements) is similar from an actual program viewpoint. The fault and layout link information may be directly stored in fault and layout link information storage 91 without preparing the layout parameters (elements) link information storage 73.

In step S104, the relative weight calculator 23a shown in FIG. 5 calculates each relative weight of the number of vias, the wire length, the cell area, the adjacent wire length, and the number of vias and wire length on the critical path, based on process failure (defect) information stored in the process failure (defect) information storage 76. That is, the relative weight calculator 23a sets the value of relative weight in proportion to the occurrence frequency of open vias, wire disconnection, including resistive open and disconnection, transistor faults in the basic cells, wire shorts, and delay faults of the circuit under test. The relative weight is stored in the relative weight storage 77 shown in FIG. 6. As described above, with respect to the calculation of the relative weight and the required weighted fault coverage, a system can be used by providing a weighted test pattern generator corresponding to the fault models linked with the layout parameter (element) information to be used in the processor 2a, selecting the fault models in accordance with an object LSI, and directly supplying the relative weights and the required weighted fault coverages via the input unit 3. This system can be used because it is difficult to execute the calculation by automatically selecting the fault models.

In step S105, the relative weight calculator 23a calculates the required weighted fault coverage corresponding to layout parameter (element) information linked with each fault model, based on the process failure (defect) information stored in the process failure (defect) information storage 76, and stores the required weighted fault coverage in required weighted fault coverage storage 75 shown in FIG. 6. The judgment unit 25 shown in FIG. 1 selects required fault coverage corresponding to layout parameter (element) information linked with the fault model from required fault coverage list storage 75, shown in FIG. 6. For example, when the layout parameter (element) information is the number of vias utilized for detecting the pin stuck-at fault, the wire length utilized for detecting the pin stuck-at fault, the cell area utilized for detecting the pin stuck-at fault, the adjacent wire length utilized for detecting the bridge fault, and the number of vias and wire length on critical path utilized for detecting path delay fault, the required weighted fault coverage is set to 99%, 99%, 98%, 98%, and 98%, respectively.

In step S106, the achievement-degree weight calculator 23b shown in FIG. 5 calculates achievement degree "$A_i$" for the number of vias, the wire length, the cell area, the adjacent wire length, and the number of vias and wire length on the critical path linked with each fault model, based on the information in fault and layout link information storage 91. Here, when it is assumed that each layout parameter (element) linked with the fault models is "i", the total weight of faults listed in the undetected fault list stored in the fault list storage 74 is "$\alpha_i$", total weight of faults extracted and linked in step S102 and S103 is "$\beta_i$", and a required fault coverage having no weight is "$\gamma_i$", the achievement degree "$A_i$" is represented by:

$$A_i = \{\alpha_i - (1-\gamma_i)\beta i\}/(\beta_i\gamma_i)(\alpha_i \geq (1-\gamma_i)\beta_i)$$

$$0(\alpha_i < (1-\gamma_i)\beta_i) \quad (1)$$

The achievement degree is a high value when the achievement degree of the required fault coverage is low. The total weight "$\beta_i$" may be stored in an appropriate storage after the total weight "$\beta_i$" is calculated. The achievement degree calculated by the achievement-degree weight calculator 23b is stored in an achievement degree storage 81 shown in FIG. 6.

In step S107, detection-expected fault extractor 23c, shown in FIG. 5 extracts detection-expected faults expected to detect a fault at the same time. For example, the weight of the extracted detection-expected fault is a weight corresponding to layout parameters (elements) linked with each fault model obtained in step S103 multiplied by a predetermined detection-expected value.

In step S108, the total weight calculator 23d calculates a total weight for each undetected fault by use of the fault and layout link information generated in step S103, the relative weight calculated in step S104, the achievement degree calculated in step S106, and information of the detection-expected faults obtained in step S107. Here, when it is assumed that the relative weight of the number of vias of the pin stuck-at fault is "W1", the achievement degree weight of the number of vias is "A1", the detection-expected fault weight of the number of vias is "B1", the relative weight of the wire length is "W2", the achievement-degree weight of the wire length is "A2", the detection-expected fault weight of the wire length is "B2", the relative weight of the cell area is "W3", the achievement-degree weight of the cell area is "A3", the detection-expected fault weight of the cell area is "B3", the weight of undetected faults of pin stuck-at faults "W(pin)" is represented by:

$$W(pin) = W1 \cdot A1 \cdot B1 + W2 \cdot A2 \cdot B2 + W3 \cdot A3 \cdot B3 \quad (2)$$

When it is assumed that the relative weight of the adjacent wire length is "W4", the achievement-degree weight of the adjacent wire length is "A4", and detection-expected fault weight of the adjacent wire length is "B4", the undetected fault weight "W(bridge)" of bridge fault is represented by:

$$W(bridge) = W4 \cdot A4 \cdot B4 \quad (3)$$

When it is assumed that the relative weight of the number of vias and wire length on critical paths is "W5", the achievement-degree weight of the number of vias and wire length on critical paths is "A5", and the detection-expected weight of the number of vias and wire length on critical paths is "B5", the undetected fault weight "W(delay)" is represented by:

$$W(delay) = W5 \cdot A5 \cdot B5 \quad (4)$$

It is noted that, the weight B1 of detection-expected faults against the number of vias, the weight B2 of detection-expected faults against the wire length, the weight B3 of detection-expected faults agains the area of a cell, the weight B4 of detection-expected faults against the adjacent wire length, and the weight B5 of detection-expected faults against the number of vias and the wire length on the critical path are weights calculated about each fault, and "normalized" weights divided by total weight of faults except for a redundancy corresponding to each fault. The faults of one fault model (stuck-at fault for instance) may have weight of another fault model. Therefore, the total weight of faults is represented by:

$$W(pin) + W(bridge) + W(delay) + \quad (5)$$

A concrete technique of calculating the weights B1 to B5 is disclosed in, for example, Jpn. Pat. Appln. KOKAI Publication No. 2004-125670; the entire contents of this reference being incorporated herein by reference.

In step S109, the prioritizing unit 23e, shown in FIG. 5, sets a priority of test pattern generation for each undetected fault in accordance with the equation (5), using each undetected fault of each fault model obtained in step S108. The cost of test patterns may be considered in the set of the priority. Basically, the cost of test patterns is a test patterns size and a clock frequency capable of performing by tester. The stuck-at fault and the bridge fault can be detected by a test pattern in case of a full scan design. On the other hand, two test patterns are required for detecting the delay fault. Data concerning the cost of test patterns can be obtained by a result of a test pattern generation for several products. The cost of test patterns are set to TPC1, TPC2, . . . for relative weights W1, W2, . . . of each fault model linked with the layout parameters, and new relative weights W1', W2', . . . are defined as W1'=W1*TPC1, W2'=W2·TPC2, . . . . An experience value from several products may be used as the cost of test patterns. Actual results of the products may be used as the cost of test patterns after generating test patterns.

In step S110, test pattern generator 22, shown in FIG. 1, generates test patterns for a predetermined number or rate of the undetected faults in accordance with the priority set in step S109. When the priority is set to a stuck-at fault, a bridge fault, and a delay fault in accordance with the total weight, the test pattern generating tool for the stuck-at fault, the test pattern generating tool for the bridge fault, and the test pattern generating tool for the delay fault generate test patterns. In order to examine faults secondarily detected by the generated test patterns, the test pattern generator 22 executes fault simulations corresponding to each fault model, and decides faults detected by each additional test pattern. A result of the test pattern generation and the fault simulation is stored in the fault list storage 74. The subject of fault for generating test patterns may be undetected faults of a predetermined number or rate of large total weight.

In step S111, the test pattern selector 24 shown in FIG. 1 selects highly effective test patterns from the test patterns generated in step S110. The selected test patterns are stored in the test pattern storage 81. The information of faults detected by the test patterns is stored in the fault list storage 74, and the detected and undetected fault list is updated. The efficiency of a test pattern is determined by whether a weight considering a relative weight concerning to subject of fault is larger than a predetermined value. When a test pattern is selected, faults to be detected by remaining test patterns and the weights are influenced by the selected test pattern. Therefore, the selection may consider the influence (refer to, for example, Jpn. Pat. Appln. KOKAI Publication No. 2001-273160; the entire contents of this reference being incorporated herein by reference).

In step S112, the judgment unit 25 judges whether weighted fault coverage of the test patterns obtained in steps S110 and S111 satisfies the required fault coverage. When it is judged that the weighted fault coverage does not satisfy the required fault coverage, the procedure returns to step S106. When it is judged that the all weighted fault coverage of each fault model linked with the layout satisfies each required fault coverage, the procedure is completed. When effective test patterns cannot be added regardless of a repeat of the procedure of step S106 to step S111, the procedure may be forcibly completed as "abnormal end".

As described above, according to the first embodiment, it is possible to prioritize the generation of test patterns corresponding to faults that frequently occur in the circuit under test. Therefore, it is possible to reduce the test period and the test cost since it is possible to obtain the most effective test patterns with a minimum number of test patterns. As a result, it is possible to provide a test pattern generating apparatus, a method for automatically generating test patterns, and a computer program product for executing an application for a test pattern generating apparatus, which is capable of achieving a sufficiently high test quality for the DSM process. It is possible to effectively reduce resources for additional test patterns since it is possible to give priority to additionally detected and undetected fault.

Second Embodiment

Figure 8:
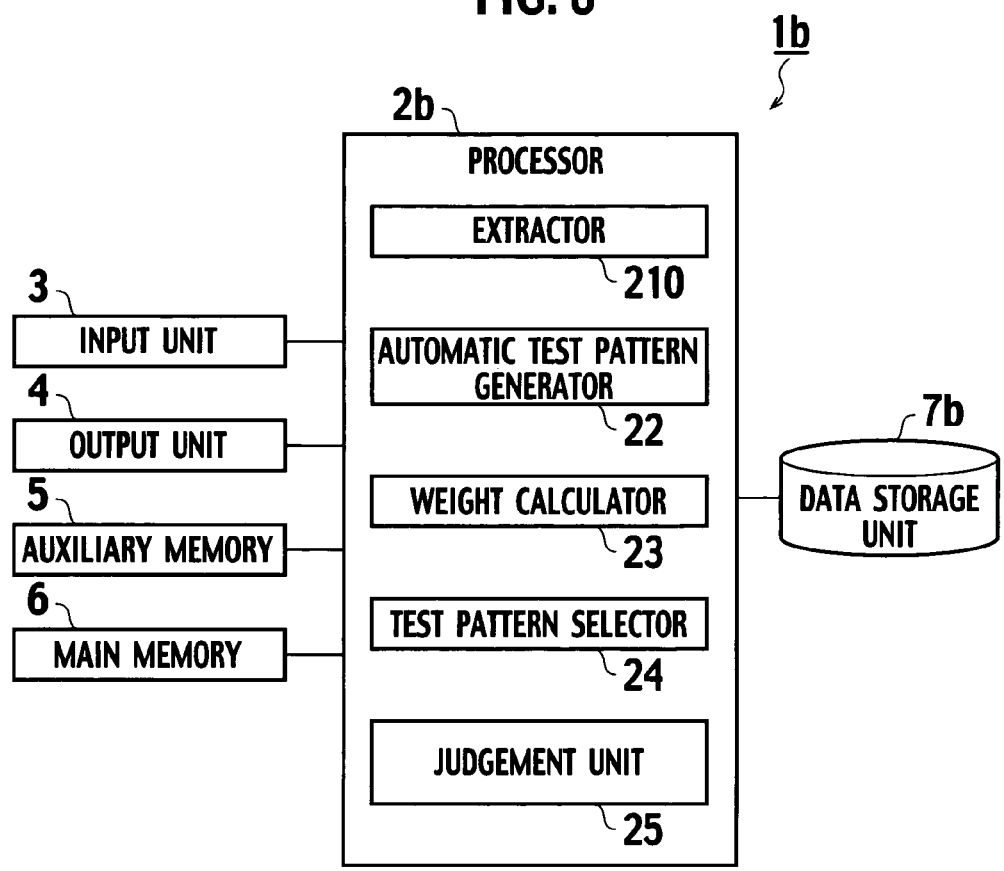
FIG. 8 is a block diagram showing a test pattern generating apparatus according to a second embodiment of the present invention.
Figure 9:
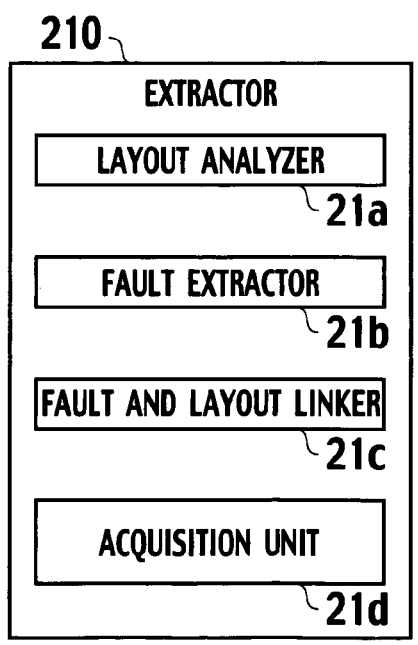
FIG. 9 is a block diagram showing an extractor according to the second embodiment.
Figure 10:
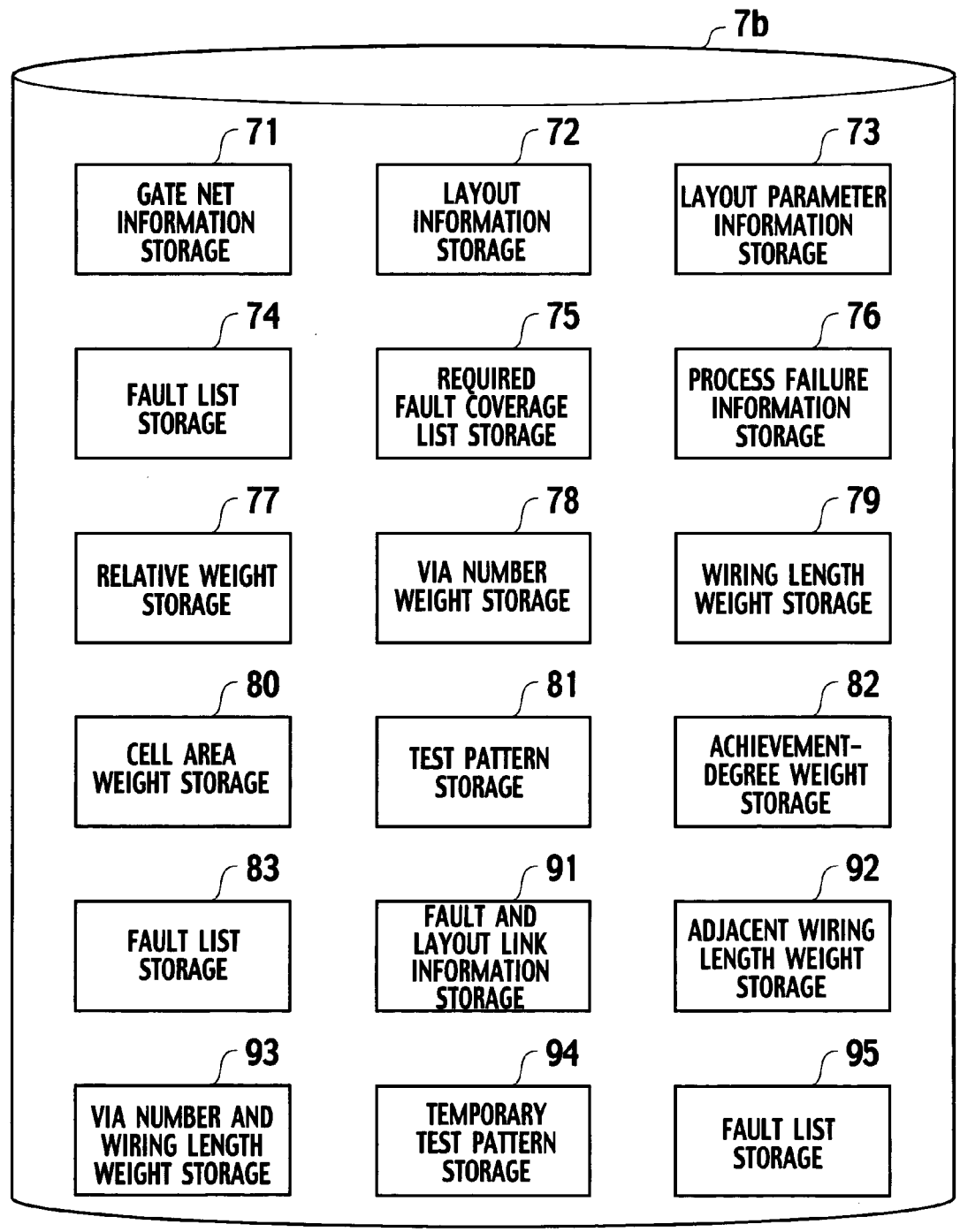
FIG. 10 is a block diagram showing a data storage according to the second embodiment.

As shown in FIG. 8, a test pattern generating apparatus 1b according to second embodiment of the present invention is similar to the test pattern generating apparatus 1a shown in FIG. 1. As shown in FIG. 9, an analyzer 210 includes an acquisition unit 21d configured to acquire temporary test patterns from the data storage unit 7b. As shown in FIG. 10, the data storage unit 7b includes a temporary test pattern storage 94 configured to store temporary test patterns generated regardless of weights, and a fault list storage 95. Other arrangement is similar to test pattern generating apparatus 1a shown in FIG. 1.

A function test, a scan test, and a BIST can be utilized as a technique of obtaining the temporary test patterns. The test pattern generator 22 may generate temporary test patterns by generating test patterns at random to an appropriate level.

Next, a method for automatically generating test patterns will be described with reference to FIG. 8 to FIG. 11. Repeated descriptions for the same processing according to the second embodiment which are the same as the first embodiment are omitted.

Figure 11:
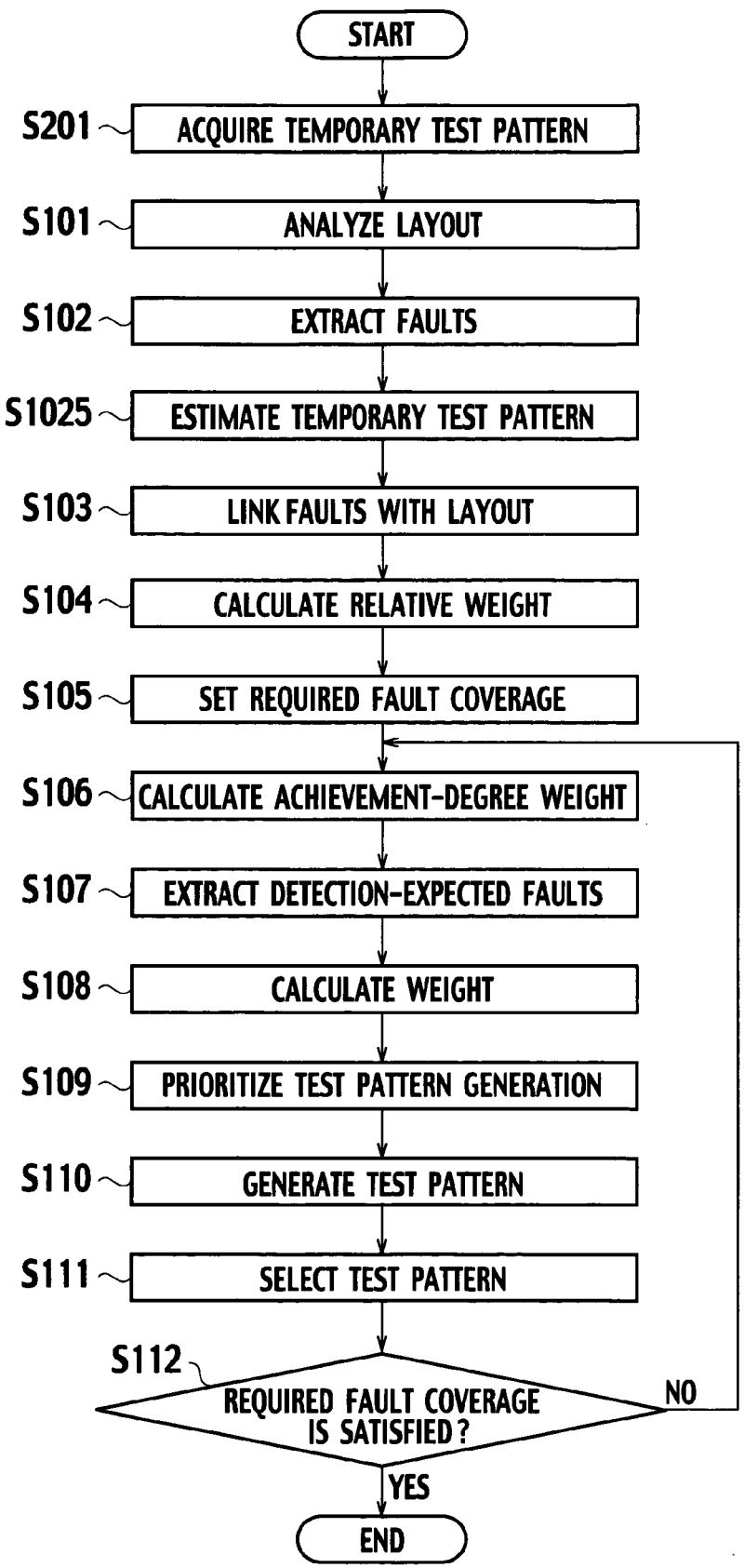
FIG. 11 is a flowchart showing a method for automatically generating test patterns according to the second embodiment.

In step S201, shown in FIG. 11, the acquisition unit 21d of FIG. 9 acquires temporary test patterns from the temporary test pattern storage 94 of FIG. 10.

In step S101, an entire layout of the circuit under test is analyzed, based on the gate net information and the layout information, and layout parameter (element) information is extracted.

In step S102, faults, such as a stuck-at fault, a bridge fault, and a delay fault, are extracted, and the extracted faults are stored in the fault list storage 83.

In step S1025, the fault coverage of the temporary test pattern is estimated against the faults stored in fault list storage 83. As a result, detected and undetected faults are stored in fault list storage 95. When the temporary test patterns are scan test patterns, a fault simulation is executed by the fault simulators in test pattern generator 22, and detected and undetected faults are stored in fault list storage 95. When the temporary test patterns is of a function test or a BIST, different fault simulators from the fault simulators accompanying the test pattern generating tools in the test pattern generator 22 is required. The fault simulators execute a fault simulation by utilizing the faults stored in the fault list storage 83 and the gate net, and the detected and undetected fault list is stored in fault list storage 95. Accordingly, temporary test patterns and a detected and undetected fault list of the temporary test patterns are directly supplied to the temporary test pattern storage 94 and the fault list storage 95, respectively, when the temporary test patterns is the function test or the BIST.

In step S103, the layout parameter (element) information and the detected and undetected fault list are linked, and fault and layout link information is generated.

In step S104, a relative weight is calculated, based on process failure (defect) information.

In step S105, required fault coverages corresponding to layout parameter (element) information are set.

In step S106, an achievement degree is calculated by the equation (1). In step S107, detection-expected faults are extracted.

In step S108, a total weight of each undetected fault is calculated by the equation (2), the equation (3), and the equation (4), based on information of the fault and layout link information obtained in step S103, the relative weight obtained in step S104, the achievement degree obtained in step S106, and detection-expected faults obtained in step S107.

In step S109, the priority of generating test patterns is set by the weight calculated in step S108.

In step S110, test patterns are generated for each fault model in accordance with the priority set in step S109, and faults to be detected by a fault simulation are fixed.

In step S111, the effective test patterns (test patterns having a weight more than or equal to a predetermined value) are selected from the generated test patterns, and the selected test patterns are stored in test pattern storage 81 of FIG. 10. In selecting the effective test patterns, the cost of test patterns may be considered.

In step S112, it is judged whether weighted fault coverage of test patterns selected in step S111 satisfies required fault coverage. When it is judged that the weighted fault coverage does not satisfy the required fault coverage, the procedure returns to step S106. When it is judged that the all weighted fault coverage of each fault model linked with the layout satisfies each required fault coverage, the procedure is completed. When effective test patterns cannot be added regardless of a repeat of the procedure, the procedure may be forcibly completed.

As described above, according to the second embodiment, it is possible to effectively generate test patterns by generating test patterns to faults undetected by the temporary test patterns because generating test patterns by weighting from the beginning is not always successful. Especially, when the temporary test patterns are generated by a function test, it is possible to reduce flip-flops to be scanned. As a result, it is possible to reduce the circuit scale of test circuits in a LSI.

Third Embodiment

Figure 12:
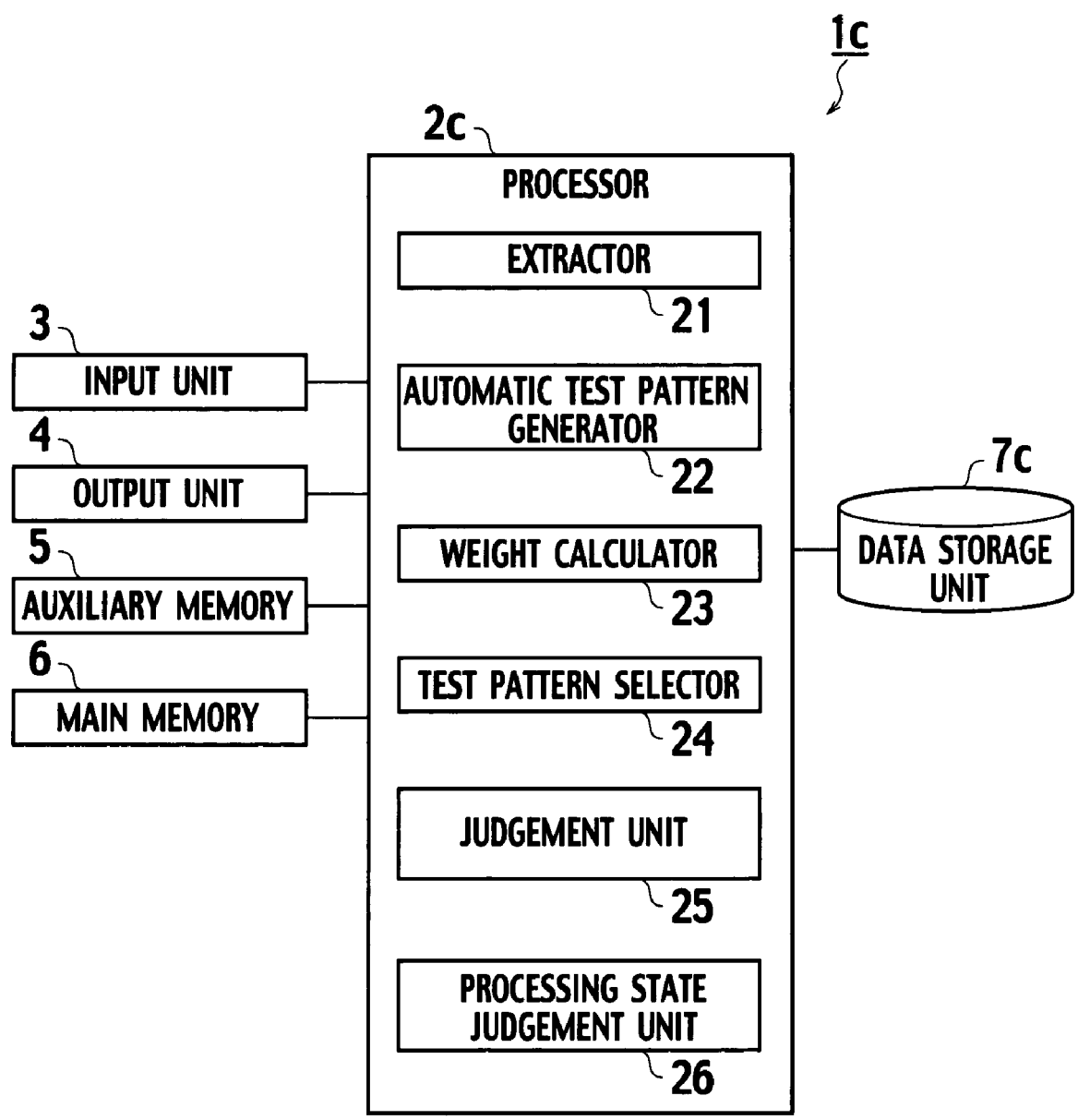
FIG. 12 is a block diagram showing a test pattern generating apparatus according to a third embodiment of the present invention.
Figure 13:
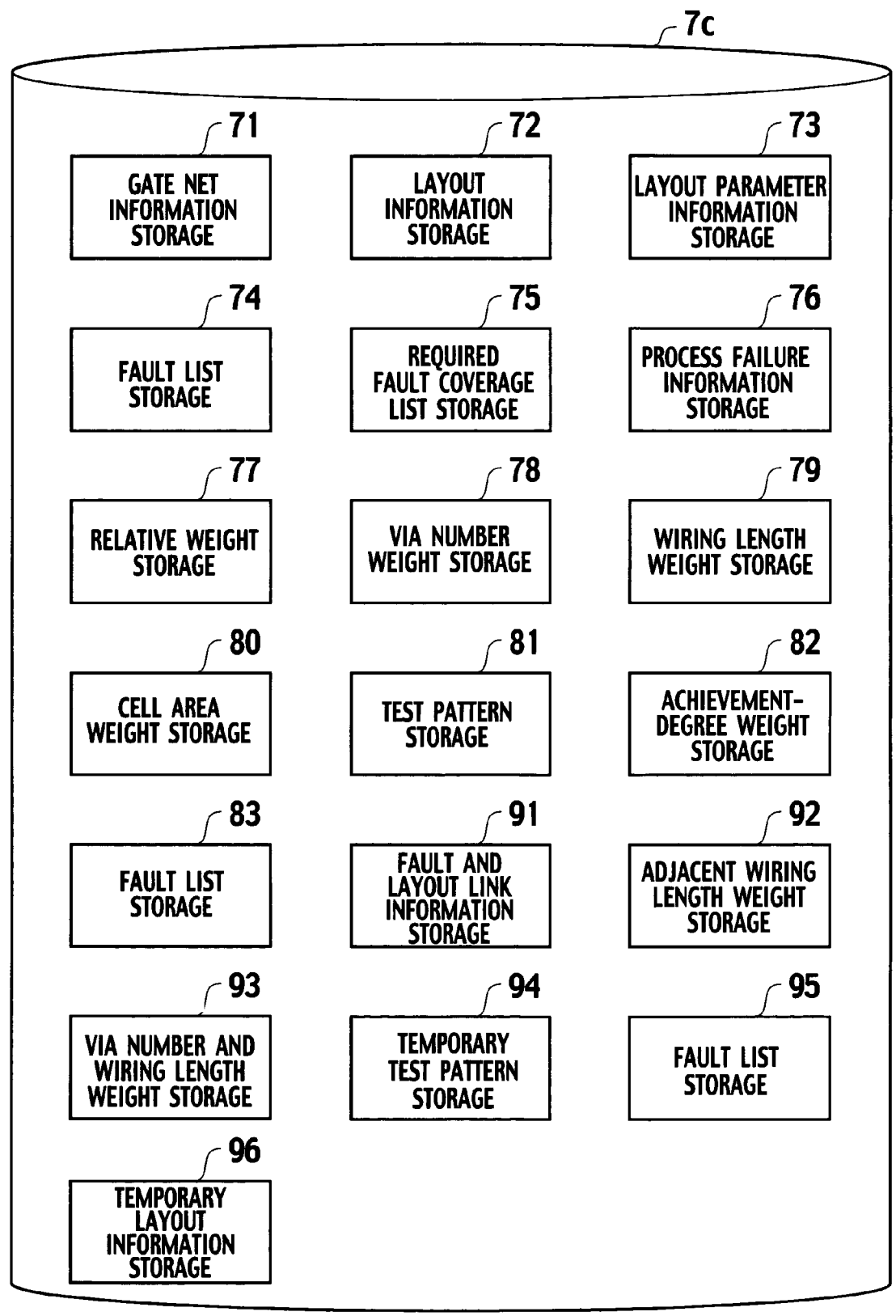
FIG. 13 is a block diagram showing a data storage according to the third embodiment.

As shown in FIG. 12, a test pattern generating apparatus 1c, according to a third embodiment of the present invention, further includes a processing state judgment unit 26 configured to judge whether a procedure of a final layout is completed. As shown in FIG. 13, the data storage unit 7c further includes a temporary layout information storage 96. The temporary layout information is obtained by an outline wire tool such as floor planner or usual place & route tool. Other arrangement is similar to test pattern generating apparatus 1a shown in FIG. 1.

Figure 14:
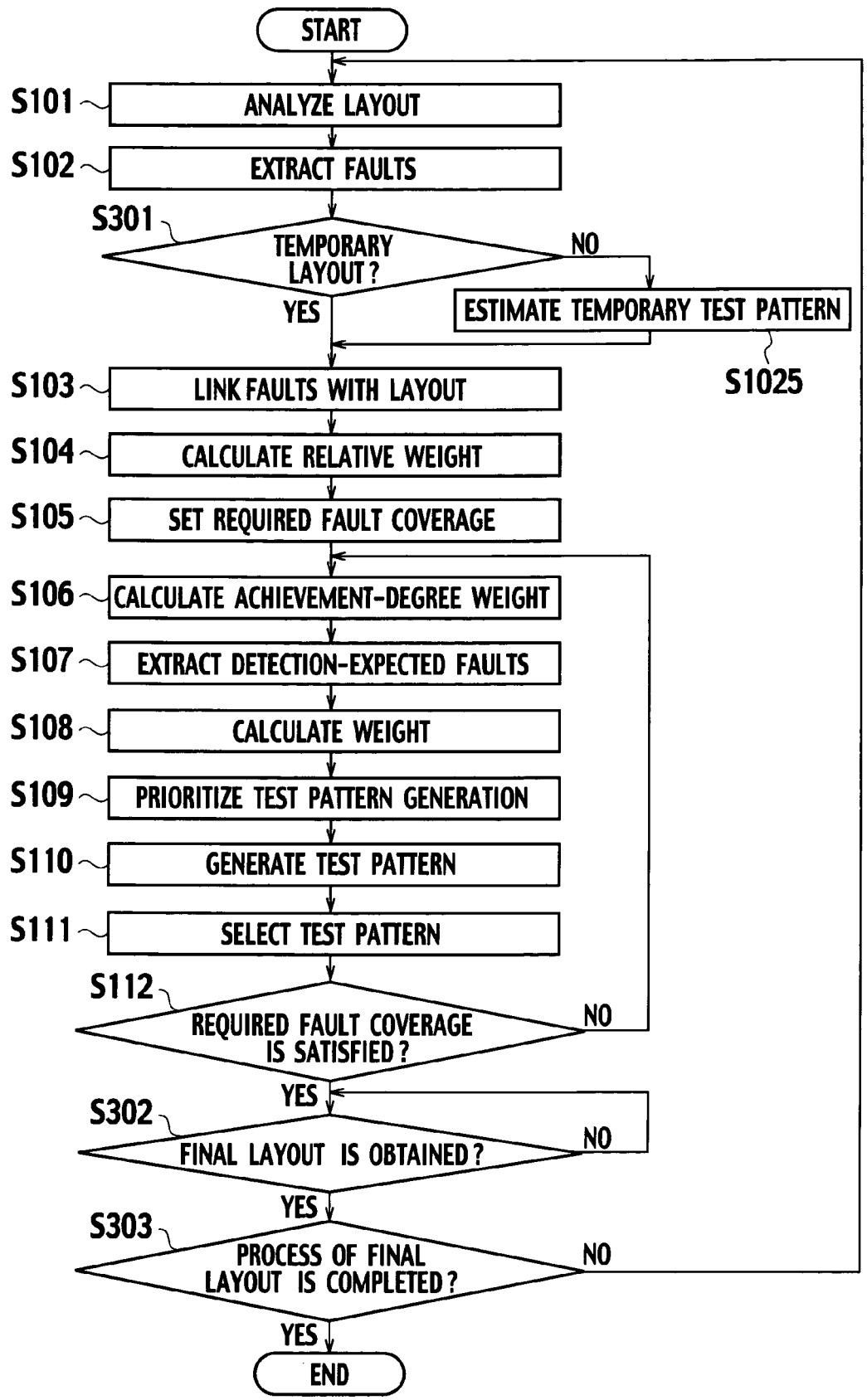
FIG. 14 is a flowchart showing a method for automatically generating test patterns according to the third embodiment.

Next, a method for automatically designing a circuit according to the third embodiment will be described with reference to FIG. 12 to FIG. 14. Repeated descriptions for the same processing according to the third embodiment which are the same as the first embodiment are omitted.

In step S101, an entire layout of the circuit under test is analyzed, based on the gate net information and temporary layout information stored in temporary layout information storage 96 of FIG. 13, and layout parameter (element) information is extracted.

In step S102, faults, such as a stuck-at fault, a bridge fault, and a delay fault, are extracted.

In step S301, it is examined whether a temporary layout information is used. When a temporary layout information is used, the procedure goes to step S103. When a temporary layout information is not used, i.e., a final layout is used, the procedure goes to step S1025.

In step S103, the layout parameter (element) information and the detected and undetected fault list are linked, and fault and layout link information is generated.

In step S104, a relative weight is calculated, based on process failure (defect) information.

In step S105, required fault coverages corresponding to layout parameter (element) information are set.

In step S106, an achievement degree is calculated by the equation (1). In step S107, detection-expected faults are extracted.

In step S108, a total weight of each undetected fault is calculated by the equation (2), the equation (3), and the equation (4), based on information of the fault and layout link information obtained in step S103, the relative weight obtained in step S104, the achievement degree obtained in step S106, and detection-expected faults obtained in step S107.

In step S109, the priority of generating test patterns is set by the weight calculated in step S108.

In step S110, test patterns are generated for each fault model in accordance with the priority set in step S109, and faults to be detected by a fault simulation are fixed.

In step S111, the effective test patterns (test patterns having a weight more than or equal to a predetermined value) are selected from the generated test patterns, and the selected test patterns are stored in the temporary test pattern storage 94 of FIG. 13. In selecting the effective test patterns, the cost of test patterns may be considered.

In step S112, it is examined whether weighted fault coverage of test patterns selected in step S111 satisfies required fault coverage. If it is judged that weighted fault coverage of test patterns satisfies required fault coverage, the procedure goes to step S302. If it is judged that weighted fault coverage of test patterns does not satisfy required fault coverage, the procedure returns to step S106.

In step S302, it is examined whether a final layout is obtained. If it is judged that a final layout is obtained, the procedure goes to step S303.

In step S303, the processing state judgment unit 26 of FIG. 12 examines and judges whether the steps of the layout analyze (S101) to the test pattern selection (S111) are executed. When these steps have been already executed, the procedure is completed. When these steps have not been already executed, the procedure returns to step S101.

In step S101, an entire layout of the circuit under test is analyzed, based on the gate net information stored in a gate net information storage 70 and the layout information stored in a layout information storage 71, and layout parameter (element) information is extracted. Although gate net information may be updated from temporary layout information, gate net information corresponding to the final layout must be used.

In step S102, various faults are extracted. In the judgment of step S301, the procedure goes to step S1025 because the layout is final layout.

In step S1025, a fault coverage and a detected and undetected fault list for faults are obtained by a fault simulation. The detected and undetected fault list is stored in fault list storage 95. When all temporary test patterns are utilized, the detected and undetected fault list may be directly stored in fault list storage 74. In this case, the fault list storage 95 is unnecessary.

In step S103, fault and layout link information is generated, based on the detected and undetected fault list, the fault and layout link information is stored in fault and layout link information storage 91 of FIG. 13.

The following procedure is similar to the case of the temporary layout. Generating additional test patterns for final layout information is completed in a short time because almost all faults having large weight are detected, based on the temporary layout information.

As described above, according to the third embodiment, it is possible to generate test patterns by using temporary layout information beforehand. As a result, generating test patterns for final layout is completed in a short time. Therefore, it is possible to obtain ideally test patterns in synchronization with developing a semiconductor integrated circuit.

Other Embodiments

Various modifications will become possible for those skilled in the art after receiving the teachings of the present disclosure without departing from the scope thereof.

In the aforementioned first to third embodiments, the test pattern generator 22 deals with a plurality of fault model. However a plurality of test pattern generator may be utilized for each fault model. Or, a function extension of the test pattern generator for specific fault model may treat another fault model. A number of test patterns, a required period for generating test patterns, and a clock frequency are different in accordance with the sort of fault models. The number of test patterns, the required period for generating test patterns, and the clock frequency may be included in a relative weight for each fault model. In this case, it is possible to obtain test patterns at a low cost and in a short time.

In the aforementioned first to third embodiments, with respect to faults failed to generate test patterns in spite of a large weight, information of the faults failed to generate test patterns is stored. An observation point or a control point is inserted after generating test patterns. Or, an observation point or a control point is inserted for each loop, the result is utilized next time. In this case, it is possible to obtain better test patterns because a difficulty of a test gradually decreases. Therefore, it is possible to certainly achieve a required test quality.

Furthermore, the relative weight may include a test patterns cost for each fault model. The method for automatically generating test patterns may further include calculating a weighted fault coverage by acquiring temporary test patterns. Moreover, the method for automatically generating test patterns may further include acquiring temporary layout information, extracting layout parameters (elements), and linking fault with the layout parameters (elements).

What is claimed is:

1. A test pattern generating apparatus comprising:
   an extractor configured to extract a plurality of layout parameters of a circuit under test based on gate net information and layout information of the circuit, and to link the layout parameters with corresponding fault models respectively;
   a weight calculator configured to calculate a weight for each fault model linked with the layout parameters for both a plurality of undetected faults of the fault model and a plurality of faults detected by a plurality of test patterns, based on process failure information and layout parameter information;
   an automatic test pattern generator configured to generate the test patterns in accordance with the weight of each fault model linked with the layout parameters;
   a test pattern selector configured to select a plurality of effective test patterns from the generated test patterns, based on the weight calculated by the weight calculator; and
   a judgment unit configured to judge whether a fault coverage of the selected test patterns satisfies a required fault coverage set to the layout parameter information,
   wherein
   the layout parameters include at least one of a metal wire, a pair of adjacent wires, a via, or a primitive cell,
   the layout parameter information includes at least one of a length of the metal wire, a length of adjacent part of wires, a quantity of vias, a quantity of vias in a critical path or a length of the metal wire on a critical path, or an area of the primitive cell; and
   the plurality of faults detected by the plurality of test patterns include information on frequencies of short, open, restive short, or resistive open failure occurrences.

2. The test pattern generating apparatus of claim 1, wherein the weight calculator comprises:
   a relative weight calculator configured to calculate a relative weight among the fault models linked with the layout parameter information, based on the process failure information and the layout parameter information; and
   an achievement-degree weight calculator configured to calculate an achievement degree of weight representing the number of remaining the undetected faults.

3. The test pattern generating apparatus of claim 1, wherein the weight calculator further comprises:
   a detection-expected fault extractor configured to extract a detection-expected fault detected at the same time as the fault;
   a total weight calculator configured to calculate a weight corresponding to a layout parameter of the undetected fault, and to calculate a weight of the detection-expected fault; and
   a prioritizing unit configured to prioritize generation of the test patterns by calculating a weight of the undetected fault, based on the relative weight, the achievement-degree weight, and the weight corresponding to the layout parameters.

4. The test pattern generating apparatus of claim 3, wherein the relative weight includes a test pattern cost of the fault model.

5. The test pattern generating apparatus of claim 1, wherein the extractor comprises:
   a layout analyzer configured to analyze an entire layout of the circuit under test, based on the layout information, and to extract the layout parameters;
   a fault extractor configured to detect the faults from the gate net information and the layout information, and to generate a detected and undetected fault list;
   a fault and layout linker configured to link the layout parameter information with the detected and undetected fault list.

6. The test pattern generating apparatus of claim 5, wherein the extractor further comprises an acquisition unit configured to acquire a plurality of temporary test patterns, and to calculate a weighted fault coverage.

7. The test pattern generating apparatus of claim 1, wherein the extractor acquires temporary layout information, and extracts the layout parameters.

8. A method for automatically generating test patterns comprising:
   extracting a plurality of layout parameters of a circuit under test based on gate net information and layout information of the circuit, and linking the layout parameters with corresponding fault models respectively;
   calculating a weight for each fault model linked with the layout parameters for both a plurality of undetected faults of the fault model and a plurality of faults detected by a plurality of test patterns, based on process failure information and layout parameter information;
   generating the test patterns in accordance with the weight of each fault model linked with the layout parameters;
   selecting a plurality of effective test patterns from the generated test patterns, based on the calculated weight; and
   determining whether a fault coverage of the selected test patterns satisfies a required fault coverage set to the layout parameter information;
   wherein
   the layout parameters include at least one of a metal wire, a pair of adjacent wires, a via, or a primitive cell,
   the layout parameter information includes at least one of a length of the metal wire, a length of adjacent part of wires, a quantity of vias, a quantity of vias in a critical path or a length of the metal wire on a critical path, or an area of the primitive cell; and
   the plurality of faults detected by the plurality of test patterns include information on frequencies of short, open, restive short, or resistive open failure occurrences.

9. The method of claim 8, wherein the calculating the weight comprises: calculating a relative weight among the fault models linked with the layout parameter information, based on the process failure information and the layout parameter information; and
   calculating an achievement degree of weight representing the number of remaining the undetected faults.

10. The method of claim 9, wherein the calculating the weight further comprises:
    extracting a detection-expected fault detected at the same time as the fault;
    calculating a weight corresponding to a layout parameter of the undetected fault, and to calculate a weight of the detection-expected fault; and
    prioritizing generation of the test patterns by calculating a weight of the undetected fault, based on the relative weight, the achievement-degree weight, and the weight corresponding to the layout parameters.

11. The method of claim 10, wherein the relative weight includes a test pattern cost of the fault model.

12. The method of claim 8, wherein the extracting the layout parameters comprises: analyzing an entire layout of the circuit under test, based on the layout information, and extracting the layout parameters;

detecting the faults from the gate net information and the layout information, and generating a detected and undetected fault list; and linking the layout parameter information with the detected and undetected fault list.

13. The method of claim 12, wherein the extracting the layout parameters further comprises acquiring a plurality of temporary test patterns, and to calculate a weighted fault coverage.

14. The method of claim 8, wherein the extracting the layout parameters comprises acquiring temporary layout information, and extracting the layout parameters.

15. A computer program product for executing an application for a test pattern generating apparatus comprising:

instructions configured to extract a plurality of layout parameters of a circuit under test based on gate net information and layout information of the circuit, and to link the layout parameters with corresponding fault models respectively;

instructions configured to calculate a weight for each fault model linked with the layout parameters for both a plurality of undetected faults of the fault model and a plurality of faults detected by a plurality of test patterns, based on process failure information and layout parameter information;

instructions configured to generate the test patterns in accordance with the weight of each fault model linked with the layout parameters;

instructions configured to select a plurality of effective test patterns from the generated test patterns, based on the calculated weight;

and instructions configured to judge whether a fault coverage of the selected test patterns satisfies a required fault coverage set to the layout parameter information; wherein the layout parameters include at least one of a metal wire, a pair of adjacent wires, a via, or a primitive cell, the layout parameter information includes at least one of a length of the metal wire, a length of adjacent part of wires, a quantity of vias, a quantity of vias in a critical path or a length of the metal wire on a critical path, or an area of the primitive cell; and the plurality of faults detected by the plurality of test patterns include information on frequencies of short, open, restive short, or resistive open failure occurrences.

16. The computer program product of claim 15, wherein the instructions configured to calculate the weight comprise: instructions configured to calculate a relative weight among the fault models linked with the layout parameter information, based on the process failure information and the layout parameter information; and instructions configured to calculate an achievement degree of weight representing the number of remaining the undetected faults.

17. The computer program product of claim 16, wherein the instructions configured to calculate the weight further comprise: instructions configured to extract a detection-expected fault detected at the same time as the fault;

instructions configured to calculate a weight corresponding to a layout parameter of the undetected fault, and to calculate a weight of the detection-expected fault; and instructions configured to prioritize generation of the test patterns by calculating a weight of the undetected fault, based on the relative weight, the achievement-degree weight, and the weight corresponding to the layout parameters.

18. The computer program product of claim 17, wherein the relative weight includes a test pattern cost of the fault model.

19. The computer program product of claim 15, wherein the instructions configured to extract the layout parameters comprise: instructions configured to analyze an entire layout of the circuit under test, based on the layout information, and to extract the layout parameters;

instructions configured to detect the faults from the gate net information and the layout information, and to generate a detected and undetected fault list; and instructions configured to link the layout parameter information with the detected and undetected fault list.

20. The computer program product of claim 19, wherein the instructions configured to extract the layout parameters further comprise instructions configured to acquire a plurality of temporary test patterns, and to calculate a weighted fault coverage.

* * * * *